(12) United States Patent
Schulze et al.

(10) Patent No.: US 7,538,412 B2
(45) Date of Patent: May 26, 2009

(54) SEMICONDUCTOR DEVICE WITH A FIELD STOP ZONE

(75) Inventors: Hans-Joachim Schulze, Ottobrunn (DE); Franz-Josef Niedernostheide, Muenster (DE); Helmut Strack, Munich (DE); Carsten Schaeffer, Sattendorf (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 194 days.

(21) Appl. No.: 11/480,150

(22) Filed: Jun. 30, 2006

(65) Prior Publication Data

US 2008/0001257 A1  Jan. 3, 2008

(51) Int. Cl.
*H01L 27/082* (2006.01)
(52) U.S. Cl. .................... 257/592; 257/590; 257/593; 257/109; 257/E29.19; 438/350
(58) Field of Classification Search .................. 257/592, 257/E29.19
See application file for complete search history.

(56) References Cited

U.S. PATENT DOCUMENTS

| | | | | |
|---|---|---|---|---|
| 5,006,477 | A * | 4/1991 | Farb | 438/231 |
| 6,482,681 | B1 | 11/2002 | Francis et al. | 438/138 |
| 6,559,023 | B2 | 5/2003 | Otsuki et al. | 438/342 |
| 6,696,705 | B1 | 2/2004 | Barthelmess et al. | 257/104 |
| 6,707,111 | B2 | 3/2004 | Francis et al. | 257/362 |
| 6,770,917 | B2 | 8/2004 | Barthelmess et al. | 257/104 |
| 6,924,177 | B2 | 8/2005 | Schulze et al. | 438/133 |
| 7,005,761 | B2 | 2/2006 | Deboy et al. | 307/116 |
| 2002/0190281 | A1 * | 12/2002 | Francis et al. | 257/262 |
| 2005/0164476 | A1 | 7/2005 | Schulze et al. | 438/515 |
| 2005/0215042 | A1 | 9/2005 | Hille et al. | 438/606 |
| 2006/0081923 | A1 * | 4/2006 | Mauder et al. | 257/335 |

FOREIGN PATENT DOCUMENTS

DE        33 39 393        5/1985

OTHER PUBLICATIONS

Application Manual Semikron International GmbH, "New developments in MOSFET and IGBT technology", pp. 35 to 40, available at http://www.semikron.com/internet/webcms/objects/applica_help/e/1_2_4-1_3_1_2.pdf (printed Apr. 4, 2006).

(Continued)

*Primary Examiner*—Tu-Tu V Ho
(74) *Attorney, Agent, or Firm*—Davidson, Davidson & Kappel, LLC

(57) ABSTRACT

A semiconductor device includes a semiconductor material, the semiconductor material including a base region and a field stop zone including a first side adjacent the base region and a second side opposite the first side. The field stop zone includes a first dopant implant and a second dopant implant. The first dopant implant has a first dopant concentration maximum and the second dopant implant has a second dopant concentration maximum with the first dopant concentration maximum being less than the second dopant concentration maximum, and being located closer to the second side than the second dopant concentration maximum.

14 Claims, 6 Drawing Sheets

OTHER PUBLICATIONS

M. Rahimo et al., "Extending the Boundary Limits of High Voltage IGBTS and Diodes to above 8kV", ISPSD 2002, pp. 1-4, Santa Fe, Jun. 3 to 7, available at: http://library.abb.com/GLOBAL/SCOT/scot256.nsf/VerityDisplay/CB753DC6EFAAD9C5C1257077002ADC1D/$File/IS02mr.pdf (printed Apr. 4, 2006).

"The Insulated Gate Bipolar Transistor", Device Modeling Group of Electronics & Electrical Engineering Department of the University of Glasgow, Scotland available at http://www.elec.gla.ac.uk/groups/dev_mod/papers/igbt/igbt.html (printed Apr. 4, 2006).

R. Siemieniec et al., "Irradiation-Induced Deep Levels in Silicon for Power Device Tailoring" J. Electrochem. Soc., vol. 153, Issue 2, pp. G108-G118 (2006), Abstract only, available at http://www.ecsdl.org/getabs/servlet/GetabsServlet?prog=normal&id=JESOAN00015300000200G108000001&idtype=cvips&gifs=Yes&session=null&setcookie=ERIGHTS.

Carl Blake et al., "IGBT or MOSFET: Choose Wisely", International Rectifier, available at http://www.irf.com/technical-info/whitepaper/choosewisely.pdf (printed Apr. 4, 2006).

* cited by examiner

SEMICONDUCTOR DEVICE WITH A FIELD STOP ZONE

BACKGROUND OF THE INVENTION

The present invention relates to semiconductor components such as IGBTs (insulated gate bipolar transistors), diodes and thyristors having a field stop zone.

A field stop zone typically is located adjacent an n-base layer. The field stop zone thus may define two sides, with a side adjacent the n-base layer, and a side away from the n-base layer. In an IGBT, a p-type collector layer typically borders the side away from the base layer. In a modified design, the field stop zone can also be surrounded by the n-base layer. In this case, the side adjacent the n-base layer is defined as the side of the n-base layer which is farther away from the p-type collector. While the field stop zone typically is a doped area of an n material, in some semiconductor components it may be a doped area of a p material.

It is known to provide more than one dopant implant in the field stop zone, with the highest concentration implant nearest the side away from the base material.

BRIEF DESCRIPTION OF THE SEVERAL VIEWS OF THE DRAWING(S)

The present invention will be further elucidated with reference to the embodiments of the drawings, in which.

DETAILED DESCRIPTION OF THE INVENTION

Figure 1:
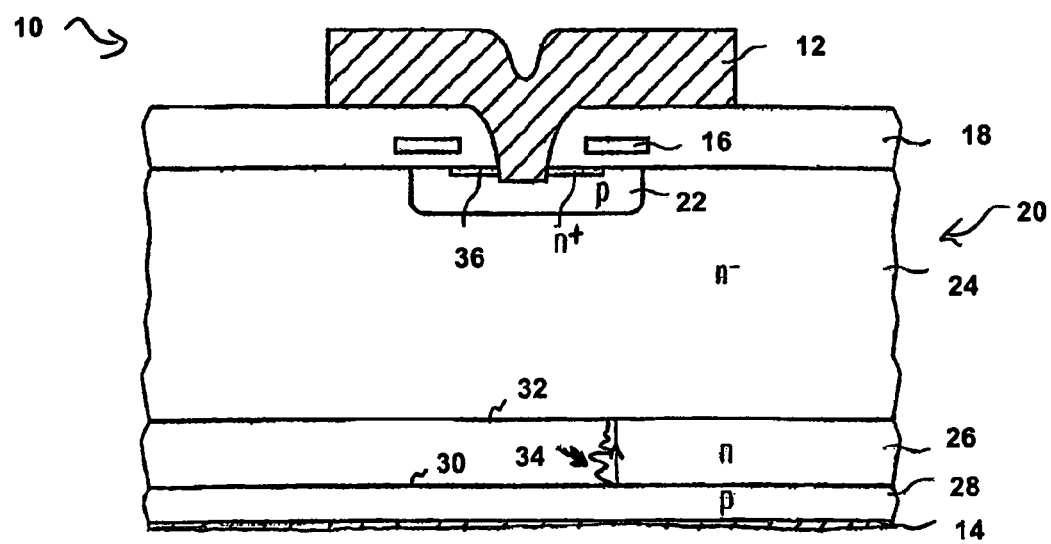
FIG. 1 shows schematically an embodiment of the present invention with an IGBT including a field stop zone.

FIG. 1 shows schematically an embodiment of the present invention with an IGBT 10 having an emitter or cathode electrical contact 12 and a collector or anode electrical contact 14, both made for example of copper or aluminium. A gate electrode 16, made for example of polycrystalline silicon, is located in a dielectric material layer 18, made for example of silicon dioxide.

A base material 20 made of a semiconductor material such as silicon has a p base region 22 introduced on an n-base region 24. A pn junction thus is formed for the device 10. An n+ emitter region 36 is located on the p base region 22.

The field stop zone has a side 30 facing away from the base region 24, and a side 32 adjacent the base region 24 and which can be defined as the area where an implanted dopant concentration approaches or reaches the dopant concentration level of the n− base region 24.

A dopant concentration profile 34 thus can be defined with increasing depth from side 30 to side 32.

A p emitter layer 28 is adjacent the field stop side 30 and is in contact with anode contact 14.

When a voltage applied to the gate electrode 16 exceeds a threshold voltage of the device, the IGBT is turned on and the resistance in the base region 24 is reduced between the cathode contact 12 and anode contact 14.

When the voltage at the gate electrode 16 is less than the threshold voltage, current flow between contacts 12, 14 will be blocked by the pn junction.

Figure 2A:
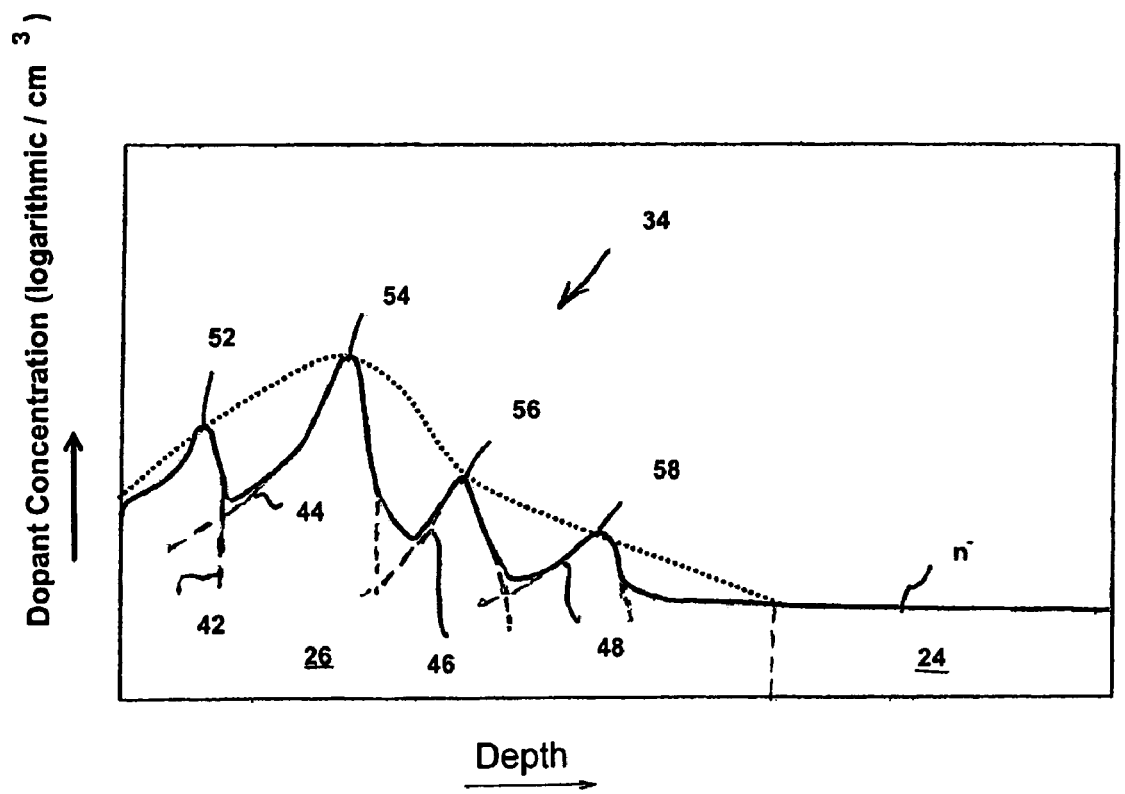
FIGS. 2a, 2b and 2c show schematically possible field stop zone dopant profiles according to a first embodiment of the present invention.

As shown in FIG. 2a, the present invention provides in a first embodiment that the field stop zone profile 34 is formed by a plurality of dopant implants 42, 44, 46, 48.

The semiconductor material which forms n-base region 24 is also used as the basis for a field stop zone 26, and the dopant implants 42, 44, 46, 48 are formed by creating defects in the silicon structure of the semiconductor material. For example, the dopant implants may be formed via proton implantations. After the proton implantations, the semiconductor material is subjected to heat treatment during an annealing step. Vacancy/hydrogen-related complexes are created which form donors in the field stop zone 26, and the number of donors per volume defines the dopant concentration.

A first dopant implant 42 has a dopant concentration maximum 52 and a second dopant implant 44 having a dopant concentration maximum 54. First dopant implant 52 may be formed for example by a proton implantation at at least 500 keV, for example at 550 keV. For this energy, the dopant concentration maximum 52 is located at a depth of about 6.5 micrometers. It may preferably have a dopant concentration of (1-5)E14/cubic centimeter for example. The second dopant implant 44 may be produced using a proton implantation at a higher energy than used during the first implantation, for example at an energy of 800 keV, and in this first embodiment advantageously provides a second dopant concentration maximum 54 with a concentration greater than the dopant concentration maximum 52, for example at (1-5)E15/cubic centimeter or ten times the amount of the first dopant concentration maximum 52. The second dopant concentration maximum 54 preferably is at least twice the amount of the first dopant concentration maximum 52. The second dopant concentration maximum 54 also is located further away from side 30, for example at about 11 micrometers.

The doping profile 34 of the present invention with the two maxima 52, 54 can optimize the turn-off response of the IGBT so that good leakage current characteristics and good short circuit ruggedness may be provided.

It is also desirable that turn-off response be soft. For such an effect, two further implants 46, 48 for example may be provided. Implant 46 may occur for example via a proton implantation at 1200 keV and provide a dopant concentration maximum 56 located at about 20 micrometer depth and with a dopant concentration of for example 5E13-2E14/cubic centimeter. Implant 48 may occur for example using a proton implantation at 1500 keV with a dopant concentration maximum 58 of for example (1-5)E13/cubic centimeter located at a depth of about 30 micrometers.

The solid line in FIG. 2a thus represents the actual dopant profile through field stop zone 26, with the dashed lines showing the dopant concentration of each implant 42, 44, 46, 48. The dotted line shows the envelope of the actual dopant profile.

It is noted that the concentration scale is logarithmic and thus minor dopant concentrations of the second implant 44, for example, at a depth of about 6.5 micrometers, have little effect on the maximum of the profile 34 caused by first maximum 52 of first implant 52.

Figure 2B:
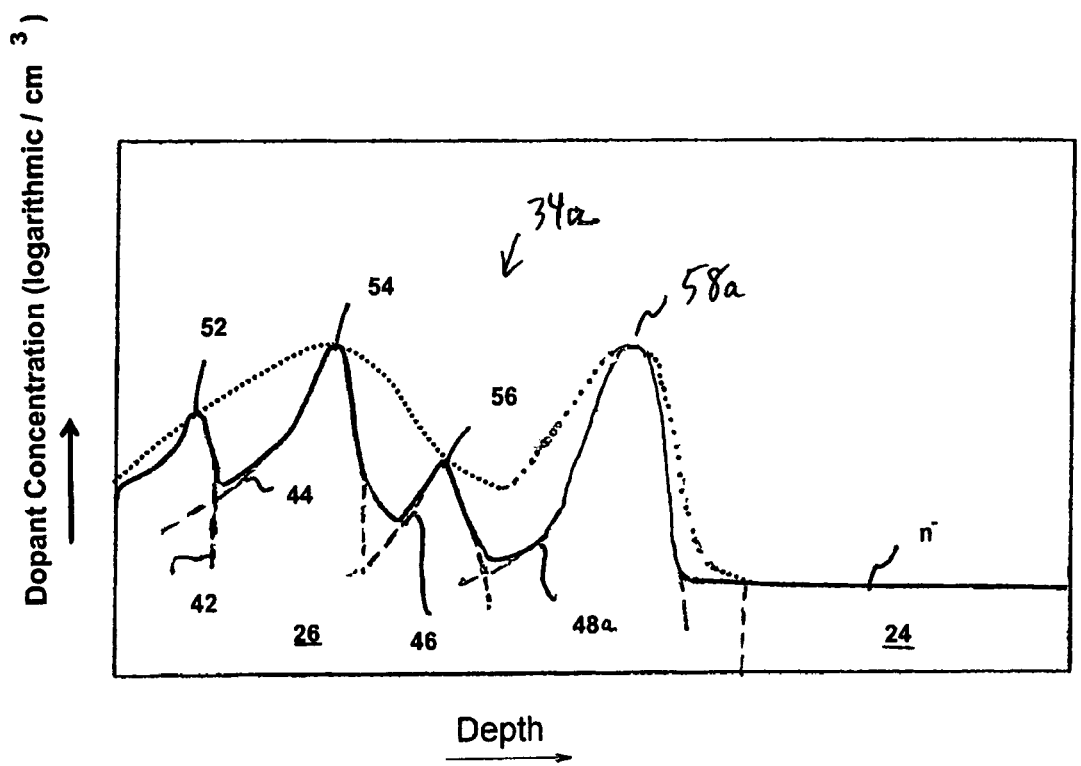
Figure 2C:
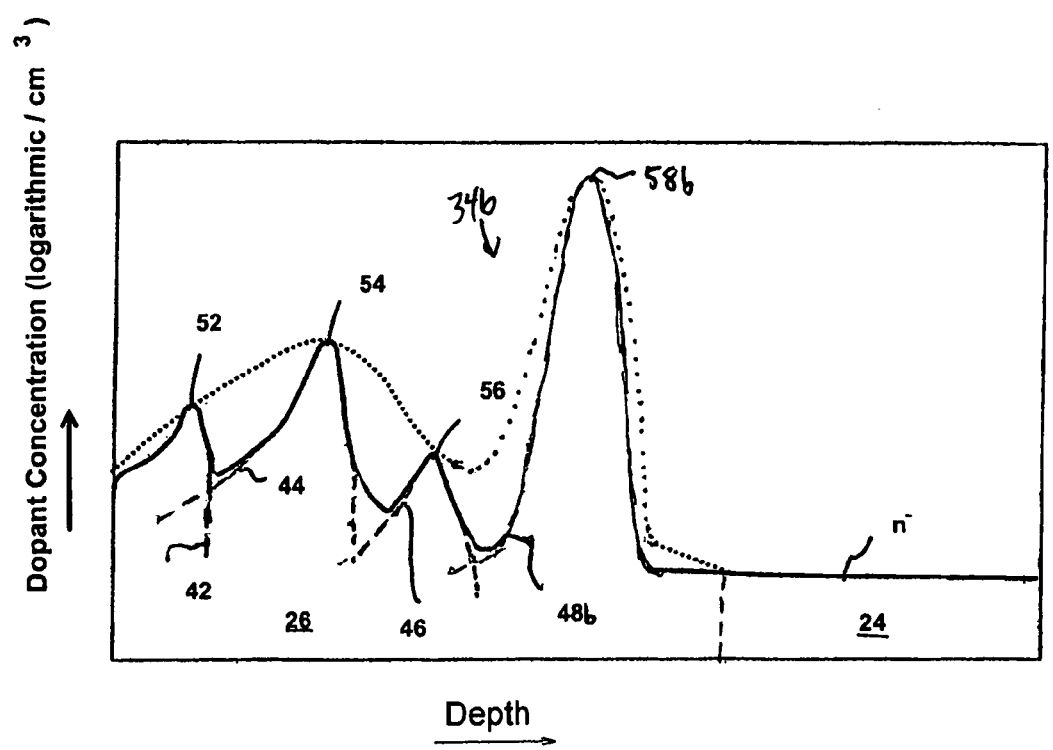

FIGS. 2b and 2c show other further possible profiles 34a and 34b, respectively, according to the first embodiment. The field stop zone of FIG. 2b has a fourth implant 48a having a fourth peak 58a having a maximum dopant concentration approximately equal to the maximum dopant concentration of peak 54. The field stop zone 58b of FIG. 2c has a fourth implant 48b having a maximum dopant concentration greater than the maximum dopant concentration of all other peaks 52, 54, 56

The implants may be produced by proton implantation from the direction of side 30, in other words the back of a wafer containing the n-base material. After the implantations, the wafer may then be annealed at for example temperatures of 300° C.-500° C. for 30 min. to 4 hrs in order to activate the hydrogen-related donors and to reduce the concentration of recombination centers such as, for example, di-vacancies or oxygen-vacancy complexes. This annealing step can result in a broadening of the donor peaks.

Alternate methods to create the profile of the present invention such as implantations through the front of the wafer however may also be possible.

As opposed to proton implantation, another option is a multiple helium implantation in combination with a controlled formation of thermal donors. Furthermore, other dopants such as phosphorus or arsenic are also possible.

The depths of the maxima may be set via an appropriate selection of the acceleration energies for the individual implants and are freely selectable in principle.

Prior art field stop zone dopant profiles often had good short circuit ruggedness but poor leakage current yields for switching, typically where the maximum was located too close to the side away from the base material. The increase in leakage current can be explained by doping inhomogeneities in the implanted region. These doping inhomogeneities are induced by particles adhering on the wafer surface during implantation and, thus, locally reducing the penetration depth of the implanted ions. Other known dopant profiles may have had good leakage current yields, but had poor short circuit ruggedness, typically where the doping maximum was located further away from the side away from the base material.

The present profile advantageously provides for excellent short-circuit ruggedness of the IGBT. Holes are delivered from the p emitter 28, and the holes partly compensate for a negative space charge on the anode side, so that the electric field gradient, and thus the maximum electric field intensity, does not assume excessively high values near the anode contact 14 when the electric field is switched over during short-circuit operation. Increased hole injection may be achieved since dopant maximum 52 has a lower dopant concentration than dopant maximum 54. This relationship also reduces the current-dependence of the emitter efficiency of the anode-side pn junction in the IGBT. For a soft decay of the current in the end phase of the switching response during turn off, the present profile also advantageously raises the charge carrier concentration between the side 30 and the second maximum 54. A sufficient amount of charge carriers in this area is available even during the end phase of the reverse recovery phase, so that the dI/dt (change in current with respect to change in time) gradient of current decay is sufficiently low and excessive overvoltages across parasitic inductivities are avoided.

Another advantage of the profile 34 is that the leakage current yield can be substantially improved. Using higher implantation energies, the radiation passes through even larger particles located on the semiconductor surface during the implantation process. A higher dopant concentration in the second implant compared to the first implant therefore delivers a better leakage current yield than in the reverse case.

P emitter 28 may be a shallow profile emitter. However, emitter variants may include, for example, thermally diffused p-emitters or p-emitters manufactured by laser annealing or emitters manufactured by a combination of these methods. In particular, annealed emitters have the advantage of a greater lateral homogeneity. Emitters manufactured in this way are characterized by higher emitting efficiency which may be further adjusted via a field stop profile according to the present invention, so that leakage currents and switching loss at nominal current and lower currents are reduced. In contrast, in the event of a short circuit, the profile has almost no effect on the emitter efficiency due to the high charge carrier concentration, as is desired.

Figure 3:
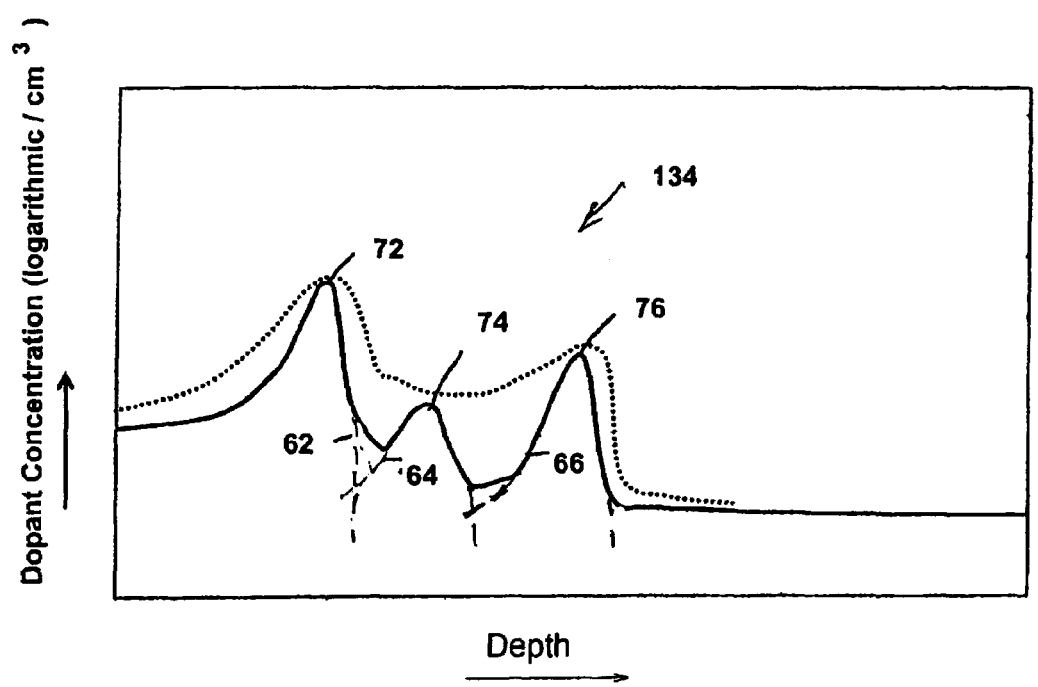
FIG. 3 shows schematically a further possible field stop zone dopant profile according to another embodiment of the present invention.

FIG. 3 shows schematically a further possible field stop zone dopant profile 134 according to another embodiment of the present invention. Three implants 62, 64, 66 with dopant concentration maxima 72, 74, 76 may be provided. Implant 62 may be created for example via a proton implantation at 800 keV, implant 64 via a proton implantation at 1200 keV and implant 66 via a proton implantation at 1500 keV. The dopant concentration maxima depths are about 11, 20 and 30 micrometers for these energies and the concentration maxima may be 2E15, 2E14 and 5E14/cubic centimeter, respectively, for example. The dip in the second concentration maximum 74 may be advantageous for turning off properties. Thus, according to another embodiment of the present invention the second dopant concentration maximum, for example dopant concentration maximum 74, has a concentration at least 10 percent smaller than either of a first or third dopant concentration maximum between which the second dopant concentration maximum is located, for example dopant concentration maximum 72 and dopant concentration maximum 76.

Figure 4:
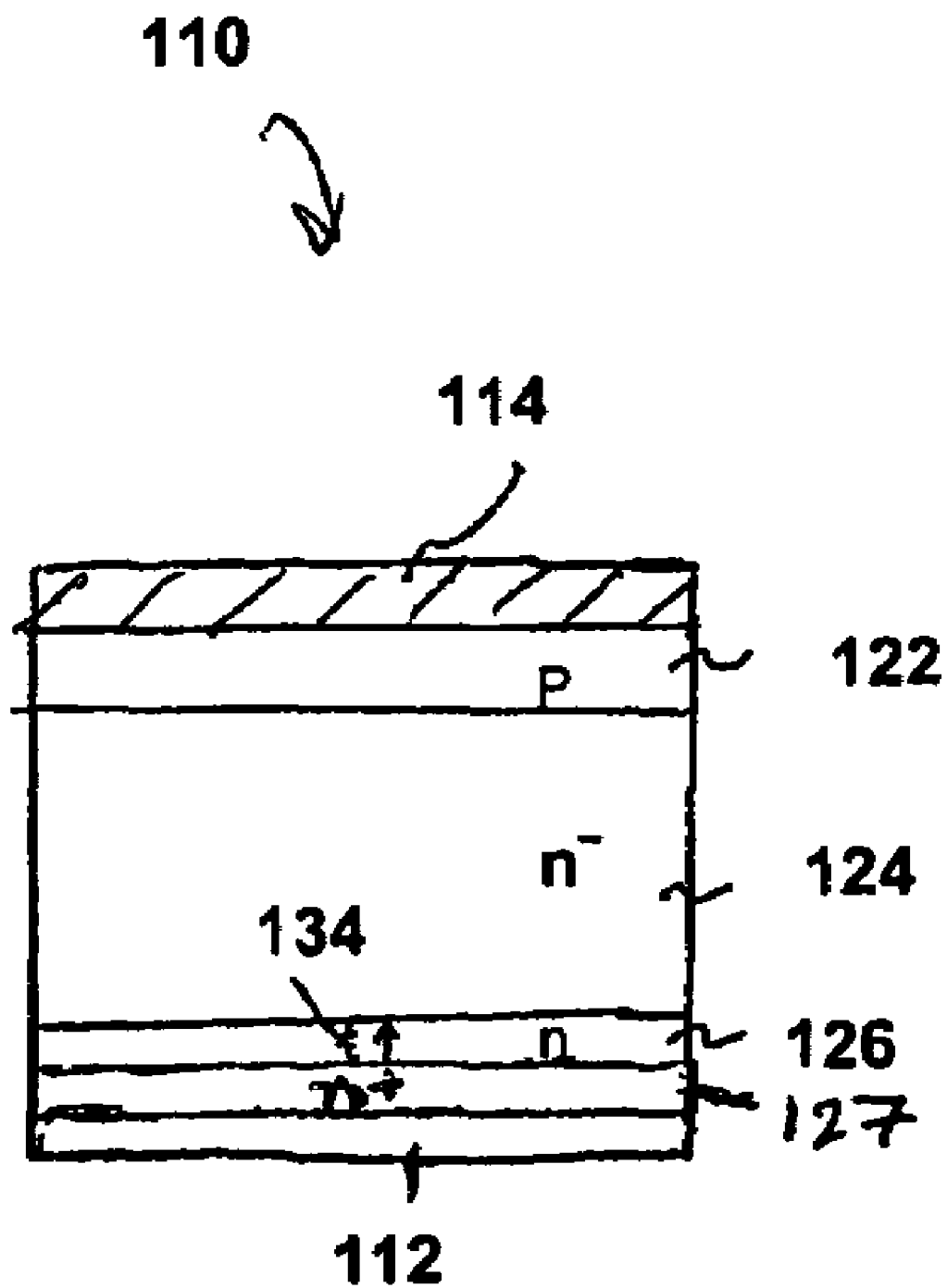
FIG. 4 shows schematically an embodiment of the present invention with a diode having a field stop zone.

FIG. 4 shows schematically a diode 110 having for example an anode contact 114 and a cathode contact 112, as well as a p emitter 122, an n+ emitter 127 and n− base 124 forming a pn junction with p-emitter 122. A field stop zone 126 for example having the profile 134 may also be provided. Diode 110 may be formed using thin film technology as with the IGBT, and the formation of the field stop zone 126 may be similar to that for the IGBT.

While the field stop zone profile has been described with n channel devices, it may also be used with p channel type devices.

What is claimed is:

1. A semiconductor device comprising:
  a semiconductor material, the semiconductor material including a base region and a field stop zone including a first side adjacent the base region and a second side opposite the first side,
  the field stop zone including a first dopant implant and a second dopant implant, the first dopant implant having a first dopant concentration maximum and the second dopant implant having a second dopant concentration maximum,
  the first dopant concentration maximum being less than the second dopant concentration maximum, and being located closer to the second side than the second dopant concentration maximum; and
  the semiconductor material having a pn junction spaced apart from the field stop zone, the pn junction being located closer to the first side than the second side.

2. The semiconductor device as recited in claim 1 wherein the first dopant concentration maximum is at least 1E14 per cubic centimeter.

3. The semiconductor device as recited in claim 1 wherein the first dopant implant includes vacancy/hydrogen-related complexes.

4. The semiconductor device as recited in claim 1 wherein the first and second dopant implant include vacancy/hydrogen-related complexes.

5. The semiconductor device as recited in claim 1 wherein the device is an IGBT, the base region including a p base region and an n base region contacting the p base region, and the device further includes a p-emitter adjacent the second side.

6. The semiconductor device as recited in claim 1 wherein the field stop zone includes a third dopant implant, the third dopant implant having a third dopant concentration maximum located further away from the second side than the second dopant concentration maximum, the third dopant concentration maximum being less than the second dopant concentration maximum.

7. The semiconductor device as recited in claim 6 wherein the field stop zone includes a fourth dopant implant, the fourth dopant implant having a fourth dopant concentration maximum located further away from the second side than the third dopant concentration maximum, the fourth dopant concentration maximum being less than the third dopant concentration maximum.

8. The semiconductor device as recited in claim 6 wherein the field stop zone includes a fourth dopant implant, the fourth dopant implant having a fourth dopant concentration maximum located further away from the second side than the third dopant concentration maximum, the fourth dopant concentration maximum being equal or greater than the third or the second or the first dopant concentration maxima.

9. The semiconductor device as recited in claim 6 wherein the third dopant concentration maximum is less than half the second dopant concentration maximum.

10. The semiconductor device as recited in claim 9 wherein the third dopant concentration is less than a third of the second dopant concentration maximum.

11. The semiconductor device as recited in claim 1 wherein the device is a diode, the base region including an n− base region and the device further comprising a p emitter adjacent the n− base region.

12. A semiconductor device comprising:
a semiconductor material, the semiconductor material including a base region and a field stop zone including a first side adjacent the base region and a second side opposite the first side, the field stop zone having a dopant concentration profile beginning at the second side, the dopant concentration profile having a plurality of maxima including a first concentration maximum and a second concentration maximum, the first dopant concentration maximum being closer to the second field stop zone side and smaller than the second dopant concentration maximum and having a concentration value of at least 1E14 per cubic centimeter; and the semiconductor material having a pn junction spaced apart from the field stop zone, the pn junction being located closer to the first side than the second side.

13. A semiconductor device comprising:
a semiconductor material, the semiconductor material including a base region and a field stop zone including a first side adjacent the base region and a second side opposite the first side, the field stop zone having a dopant concentration profile beginning at the second side, the dopant concentration profile having a plurality of maxima including a first concentration maximum and a second concentration maximum, the first dopant concentration maximum being located closer to the second side than the second dopant concentration maximum and having a concentration less than half of the second dopant concentration maximum; and the semiconductor material having a pn junction spaced apart from the field stop zone, the pn junction being located closer to the first side than the second side.

14. A semiconductor device comprising:
a semiconductor material, the semiconductor material including a base region and a field stop zone including a first side adjacent the base region and a second side opposite the first side, the field stop zone having a dopant concentration profile beginning at the second side, the dopant concentration profile having a plurality of maxima including a first concentration maximum, a second concentration maximum and a third concentration maximum located respectively away from the second side, the second dopant concentration maximum being at least ten percent lower than the first and third dopant concentration maxima.

* * * * *